(12) United States Patent
Botula et al.

(10) Patent No.: US 8,021,943 B2
(45) Date of Patent: Sep. 20, 2011

(54) SIMULTANEOUSLY FORMED ISOLATION TRENCH AND THROUGH-BOX CONTACT FOR SILICON-ON-INSULATOR TECHNOLOGY

(75) Inventors: Alan B. Botula, Essex Junction, VT (US); BethAnn Rainey, Essex Junction, VT (US); Daniel S. Vanslette, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/625,701

(22) Filed: Nov. 25, 2009

(65) Prior Publication Data
US 2011/0124177 A1 May 26, 2011

(51) Int. Cl.
*H01L 21/8238* (2006.01)
(52) U.S. Cl. .......... 438/221; 438/42; 438/212; 438/270; 257/E21.32; 257/E21.54; 257/E21.548
(58) Field of Classification Search .................. 438/206, 438/226, 242, 389, 219, 220, 222, 391; 257/E21.483, E21.49
See application file for complete search history.

(56) References Cited

U.S. PATENT DOCUMENTS

| | | | |
|---|---|---|---|
| 5,077,228 A | 12/1991 | Eklund et al. | |
| 7,256,119 B2 | 8/2007 | Grivna et al. | |
| 2004/0152324 A1* | 8/2004 | Bentum et al. | 438/690 |
| 2007/0096203 A1* | 5/2007 | Mouli | 257/330 |
| 2008/0048287 A1* | 2/2008 | Williams et al. | 257/513 |
| 2009/0302415 A1* | 12/2009 | Mueller et al. | 257/508 |

\* cited by examiner

*Primary Examiner* — Cheung Lee
(74) *Attorney, Agent, or Firm* — Gibb I.P. Law Firm, LLC

(57) ABSTRACT

A semiconductor fabrication method comprises providing a structure which includes a semiconductor substrate having a plurality of subsurface layers, the substrate comprising a top surface and the subsurface layers comprising a top subsurface layer below the top surface of the substrate. A protective material is patterned on the top surface of the device and a material removal process is performed to simultaneously form a contact trench and an isolation trench, the material removal process removing at least a portion of the top surface and the top subsurface layer such that the contact trench and the isolation trench are formed within the subsurface layer. An insulator is then formed within the isolation trench and the contact trench is lined with the insulator. The contact trench is then filled with a conductive material such that the conductive material is deposited over the insulator.

18 Claims, 15 Drawing Sheets

SIMULTANEOUSLY FORMED ISOLATION TRENCH AND THROUGH-BOX CONTACT FOR SILICON-ON-INSULATOR TECHNOLOGY

BACKGROUND OF THE INVENTION

1. Field of the Invention

The present invention generally relates to a method of forming both a device isolation structure and a through-BOX (Buried OXide) contact in the same process operation.

2. Description of the Related Art

In silicon-on-insulator technologies it is usually necessary to make device isolation structures as well as a through-BOX contact structures. These are typically created in separate steps.

The embodiments described below form both a device isolation structure and a through-BOX contact in the same process operation to isolate Silicon-On-Insulator (SOI) regions to permit devices to operate at different electrical potentials, facilitating high voltage circuits by connecting devices in series, and reduce parasitic capacitances and improving noise immunity.

SUMMARY OF THE INVENTION

In view of the foregoing and other exemplary problems, drawbacks, and disadvantages of the conventional methods and structures, an exemplary embodiment of the present invention provides a semiconductor fabrication method that provides a structure which includes a semiconductor substrate having a plurality of subsurface layers, the substrate comprises a top surface and the subsurface layers comprise a top subsurface layer below the top surface of the substrate. A protective material is patterned on the top surface of the device and a material removal process is performed to simultaneously form a contact trench and an isolation trench, the material removal process removes at least a portion of the top surface and the top subsurface layer such that the contact trench and the isolation trench are formed within the subsurface layer. An insulator is then formed within the isolation trench and the contact trench is lined with the insulator. The contact trench is then filled with a conductive material such that the conductive material is deposited over the insulator.

In another exemplary embodiment of the invention, the contact trench is connected to the semiconductor substrate. One of the pluralities of subsurface layers further comprises a silicon-on-insulator (SOI) layer, where a plurality of areas are electrically isolated within the silicon-on-insulator layer resulting from the isolation trench. The isolation trench may be filled with silicon dioxide, and the contact trench may be lined with silicon dioxide. The contact trench may be filled with a conductive material such as polysilicon. Formation of the insulator within the isolation trench and lining the contact trench with the insulator are performed simultaneously.

With these novel features, the embodiments of the invention provide the simultaneous formation of electrical isolation of multiple silicon-on insulator (SOI) regions and through-BOX contacts thereby reducing fabrication cost and time with a single operation. Isolation structures for SOI devices in a common SOI layer enable the operation of SOI devices at different electrical potentials facilitating high voltage circuits by connecting devices in series, reducing parasitic capacitances, and improving noise immunity. The through-BOX contact structure allows the substrate potential to be controlled by a terminal on the circuit side of the wafer.

BRIEF DESCRIPTION OF THE DRAWINGS

The foregoing and other exemplary purposes, aspects and advantages will be better understood from the following detailed description of an exemplary embodiment of the invention with reference to the drawings, in which.

DETAILED DESCRIPTION OF EXEMPLARY EMBODIMENTS OF THE INVENTION

Figure 1:
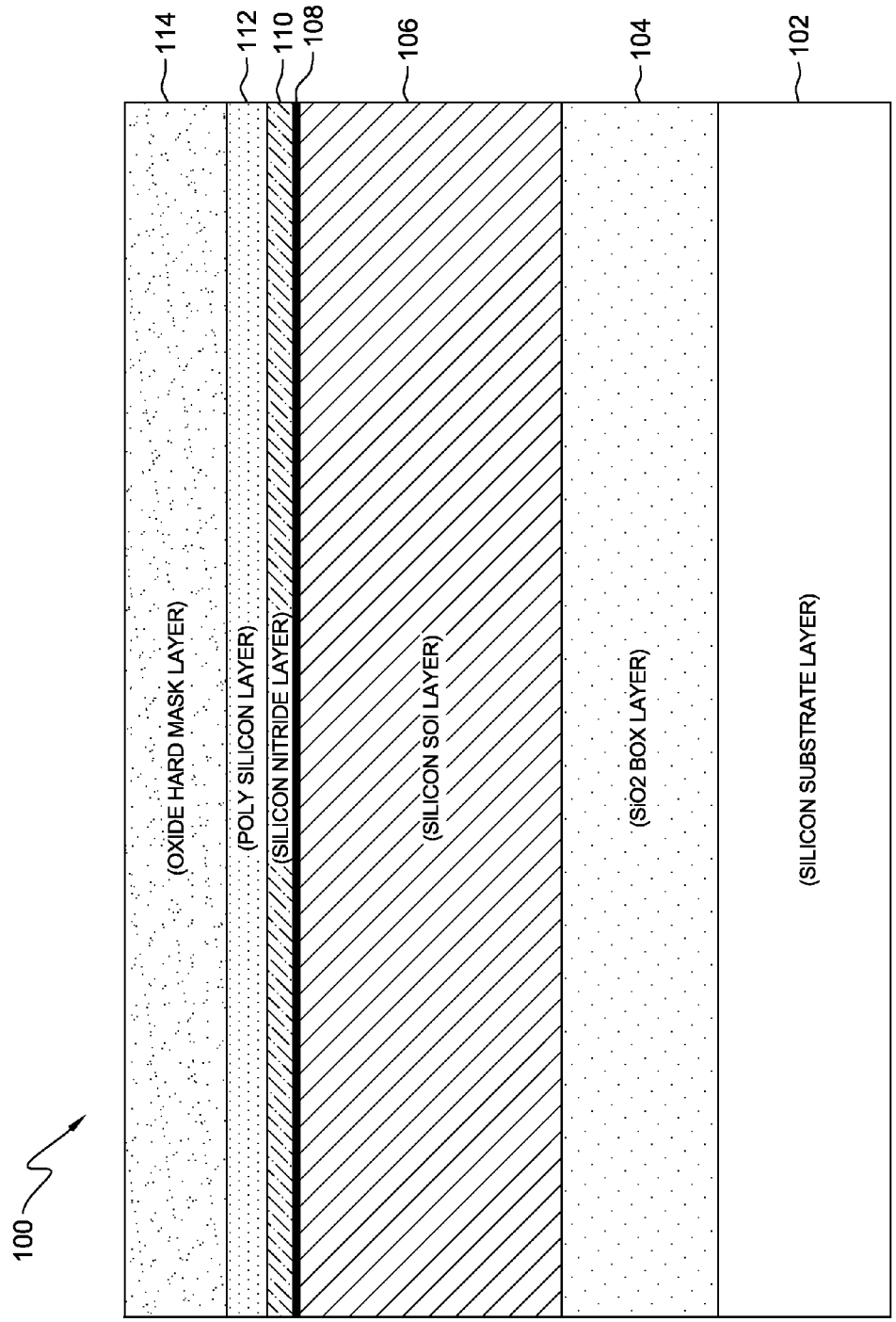
FIG. 1 is a schematic cross-sectional diagram illustrating a method of fabrication of one embodiment of the invention.

The embodiments of the invention and the various features and advantageous details thereof are explained more fully with reference to the non-limiting embodiments that are illustrated in the accompanying drawings and detailed in the following description.

Referring now to the drawings, and more particularly to FIGS. 1-15, there are shown exemplary embodiments of the method and structures of the present invention.

In silicon-on-insulator technologies it is usually necessary to make device isolation structures as well as a through-BOX contact structure. These are typically created in separate steps. Wafer process cost can be reduced by forming both the isolation structure and through-BOX contact in the same step.

The embodiment of the invention will provide significant benefit in high voltage technologies and potentially a myriad of other technologies by permitting the simultaneous formation of electrical isolation of multiple silicon-on insulator (SOI) regions and through-BOX contacts. Isolation structures permit devices, for example, SOI devices in a common SOI layer, to operate at different electrical potentials, facilitating high voltage circuits by connecting devices in series. Isolation structures also reduce parasitic capacitances and improve noise immunity. The through-BOX contact structure allows the substrate potential to be controlled by a terminal on the circuit side of the wafer.

Referring again to the drawings, FIG. 1 illustrates the deposition of hard mask films (oxides, nitrides, etc.), such as an oxide hard mask layer 114 and a polysilicon layer 112 on silicon structure including a silicon nitride layer 110, a silicon oxide ($SiO_2$) layer 108, a silicon SOI layer 106, silicon oxide ($SiO_2$) BOX layer 104 all supported on a substrate 102.

The substrate 102 can comprise any material appropriate for the given purpose (whether now known or developed in the future) and can comprise, for example, Si, SiC, SiGe, SiGeC, Ge alloys, GaAs, InAs, TnP, other III-V or II-VI compound semiconductors, or organic semiconductor structures etc. The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, and metal oxides like tantalum oxide. The thickness of dielectrics herein may vary contingent upon the required device performance.

Silicon SOI layer 106 may be thicker than conventional SOI layer thicknesses to include, for example, device junction and device well structures. After isolation trenches are fabricated, (see FIG. 4 onward), each independent SOI structure/layer is totally surrounded by oxide, therefore being completely isolated from all other SOI regions. This feature allows for individual SOI structures to operate at different operating electrical potentials, therefore facilitating high voltage circuits by connecting devices in series.

Figure 2:
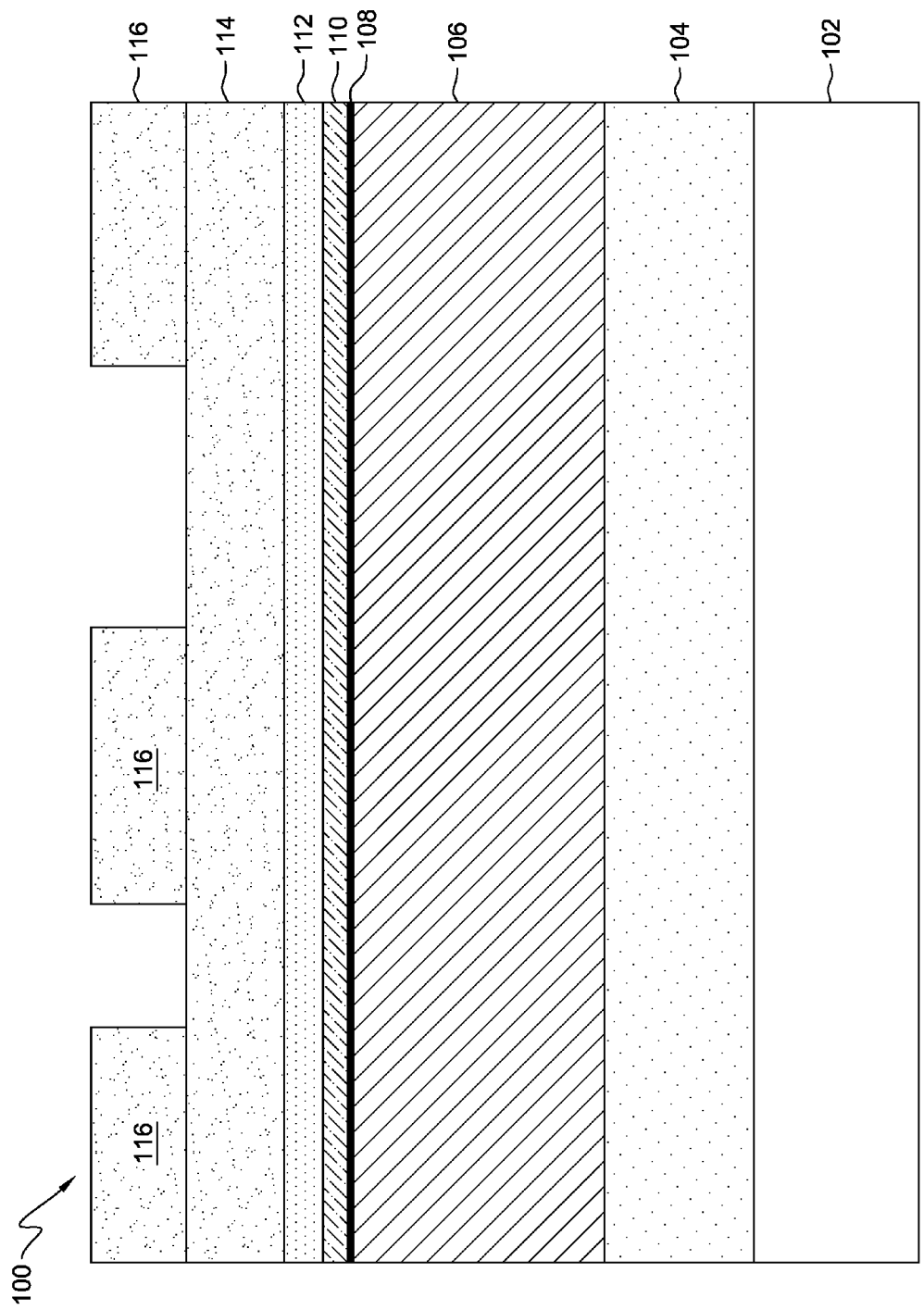
FIG. 2 is a schematic cross-sectional diagram illustrating a method of fabrication of one embodiment of the invention.

FIG. 2 illustrates the application of a photoresist mask layer 116 on oxide hard mask layer 114 in preparation for an oxide hard mask 114 strip process. The photoresist mask layer 116 can comprise any form of commonly available masking material, such as an organic photoresist. As is well known to those ordinarily skilled in the art, such masks are generally exposed to a light source (which changes their reaction to a developer) and rinsed with a developer to form a protective pattern.

Figure 3:
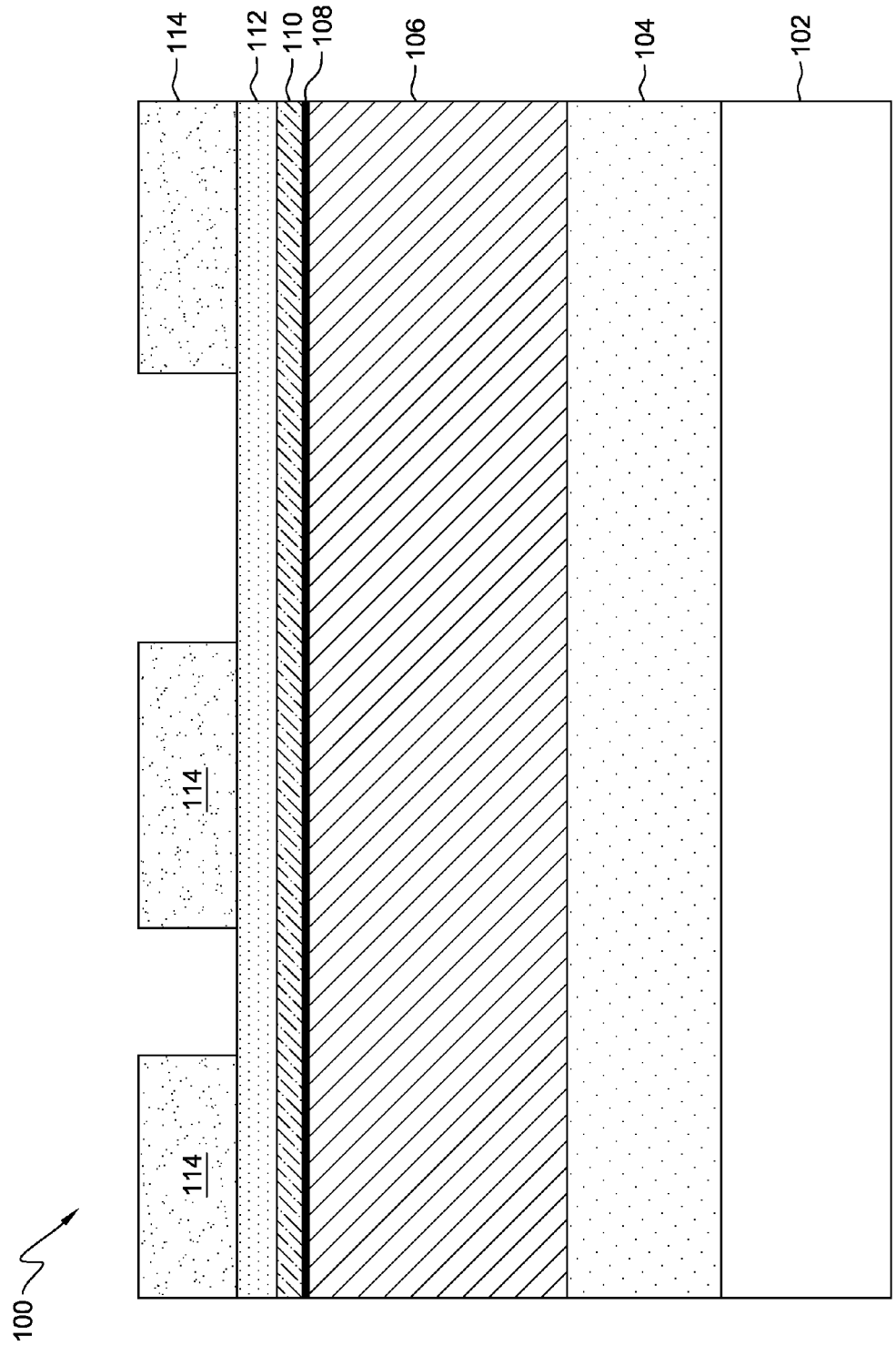
FIG. 3 is a schematic cross-sectional diagram illustrating a method of fabrication of one embodiment of the invention.

FIG. 3 illustrates a hard mask etch/strip process of the oxide hard mask layer 114 and the subsequent removal of the photoresist mask layer 116.

Figure 4:
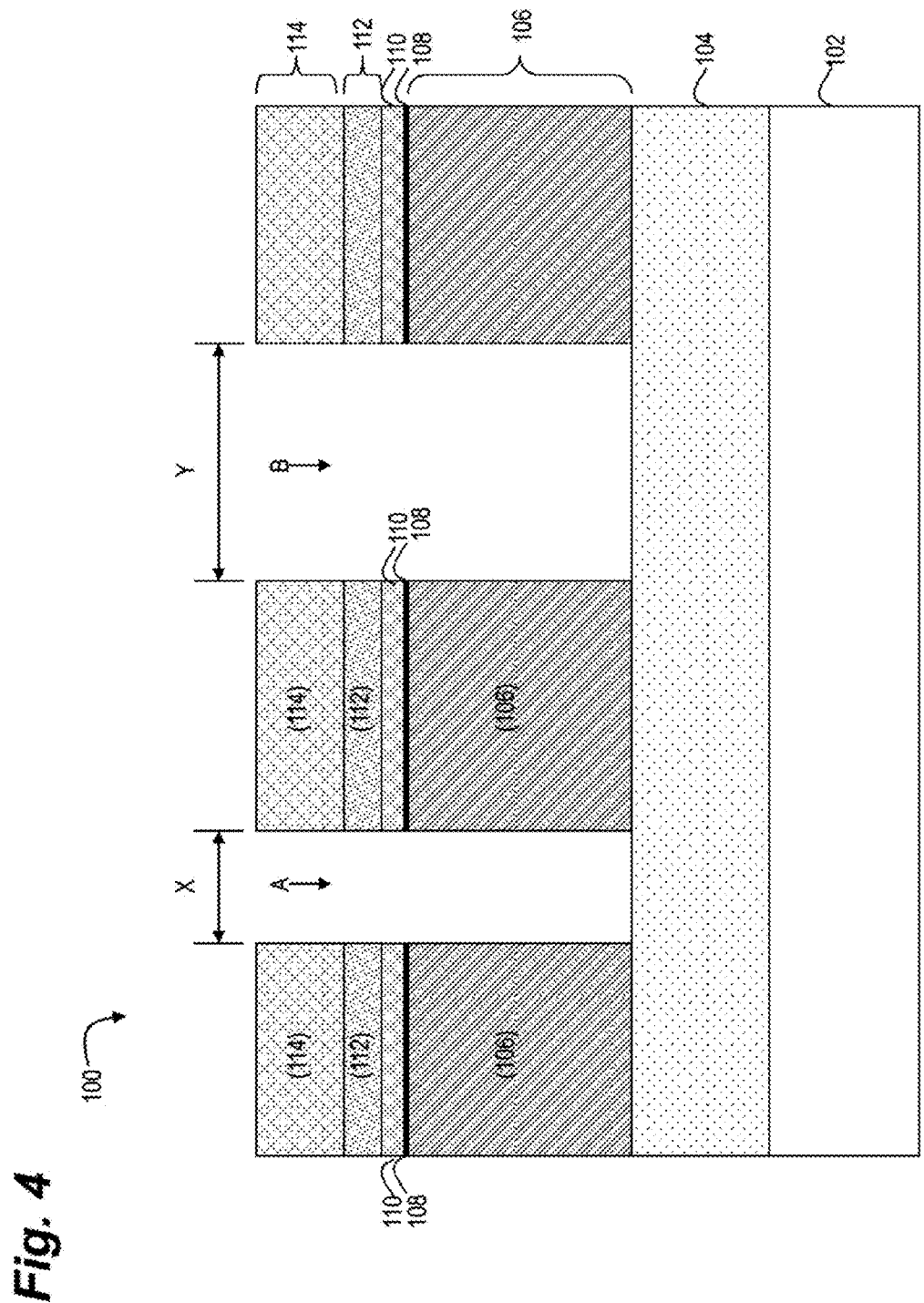
FIG. 4 is a schematic cross-sectional diagram illustrating a method of fabrication of one embodiment of the invention.

FIG. 4 illustrates a polysilicon-nitride-silicon etching process that etches through poly silicon layer 112, silicon nitride layer 110, silicon oxide layer 108 and silicon SOI layer 106 and stops etching at or around silicon oxide layer 104 to create a device isolation trench A and a through-BOX contact trench B. FIG. 4 illustrates that isolation trench A has a width of X, less than a width Y of the through-BOX contact trench B. The isolation trench electrically separates SOI 106 into separated regions. These regions may contain multiple devices, which are further separated from one another by shallow trenches and an oxide fill layer, (see FIGS. 10 and 11).

Figure 5:
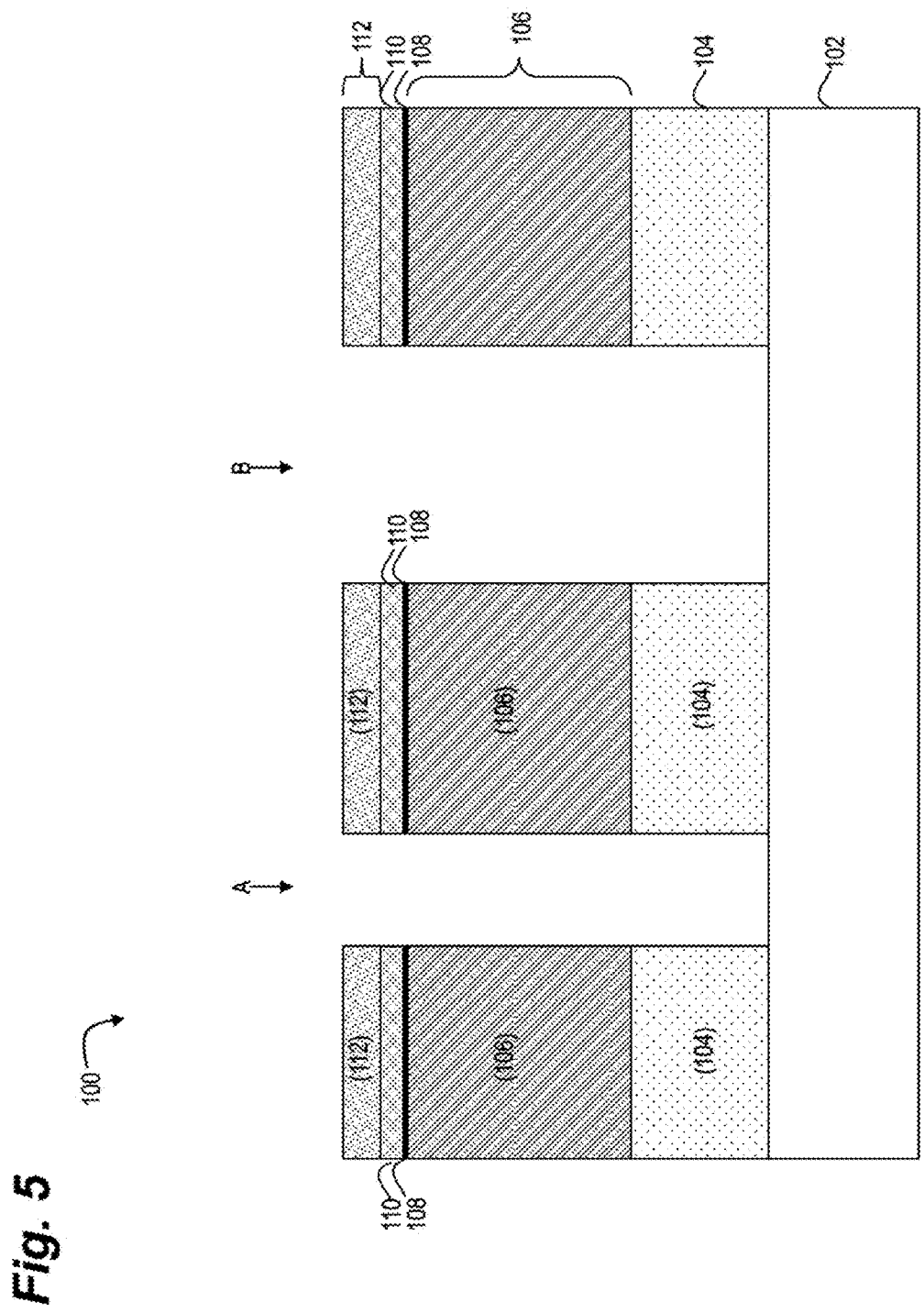
FIG. 5 is a schematic cross-sectional diagram illustrating a method of fabrication of one embodiment of the invention.

FIG. 5 illustrates an oxide etching process that further removes both the oxide hard mask layer 114 and silicon oxide BOX layer 104 to create the final depth of the device isolation trench A, and the through-BOX contact trench B on or around an upper surface of the silicon substrate 102.

Figure 6:
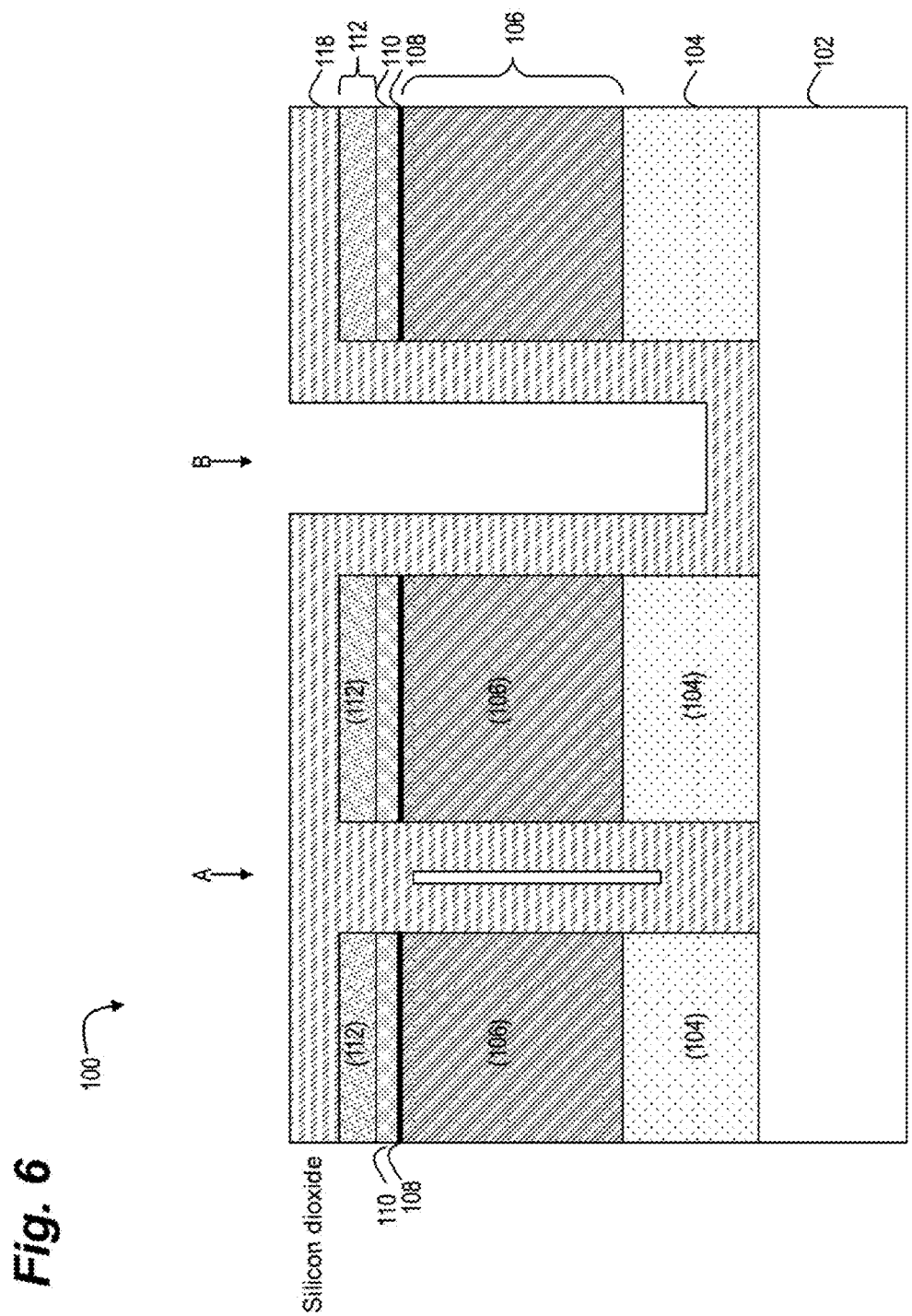
FIG. 6 is a schematic cross-sectional diagram illustrating a method of fabrication of one embodiment of the invention.

FIG. 6 illustrates the growth or deposition of an oxide layer 118 into the device isolation structure A and the through-BOX contact structure B. The oxide layer 118 substantially fills isolation trench A, but lines the sides and bottom of the contact trench B leaving a void in a middle portion of contact trench B.

Figure 7:
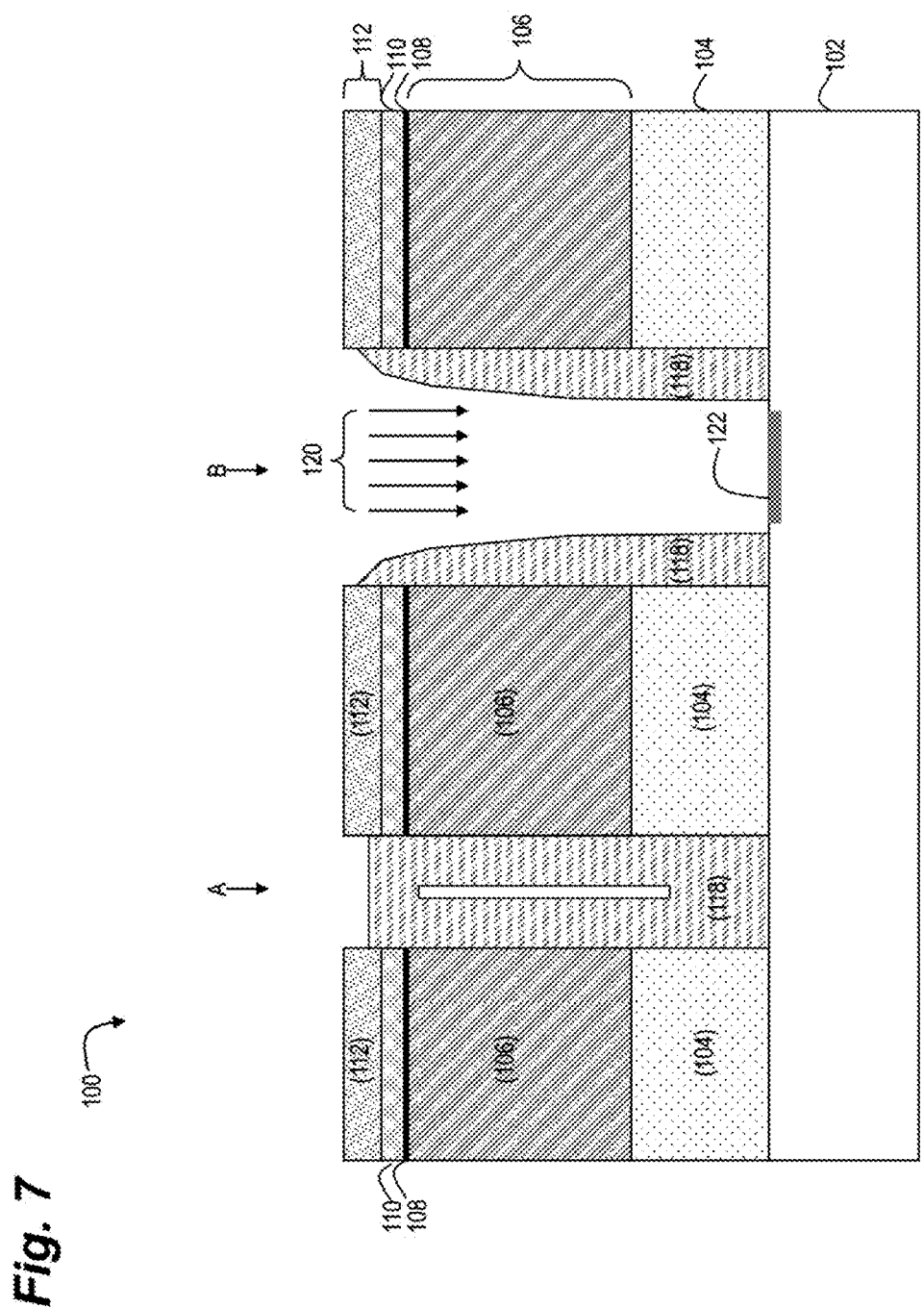
FIG. 7 is a schematic cross-sectional diagram illustrating a method of fabrication of one embodiment of the invention.

FIG. 7 illustrates an etching process of that removes a horizontally exposed portion of the oxide layer 118 from the upper surface of layer 112 and bores a channel in the contact trench B by removing the lower horizontal portion of oxide layer 118 to expose the silicon substrate 102. An optional ion implantation 120 may be made thereafter to create an ion implant 122 in the upper surface of the silicon substrate 102. The implantation processes mentioned herein can take any appropriate form (whether now known or developed in the future) and can comprise, for example, ion implantation, etc. Also see U.S. Pat. No. 6,815,317 (incorporated herein by reference) for a full discussion of implantation techniques. Different structures will utilizes different polarity dopants, different implantation energies, different dopant concentrations, etc.

Figure 8:
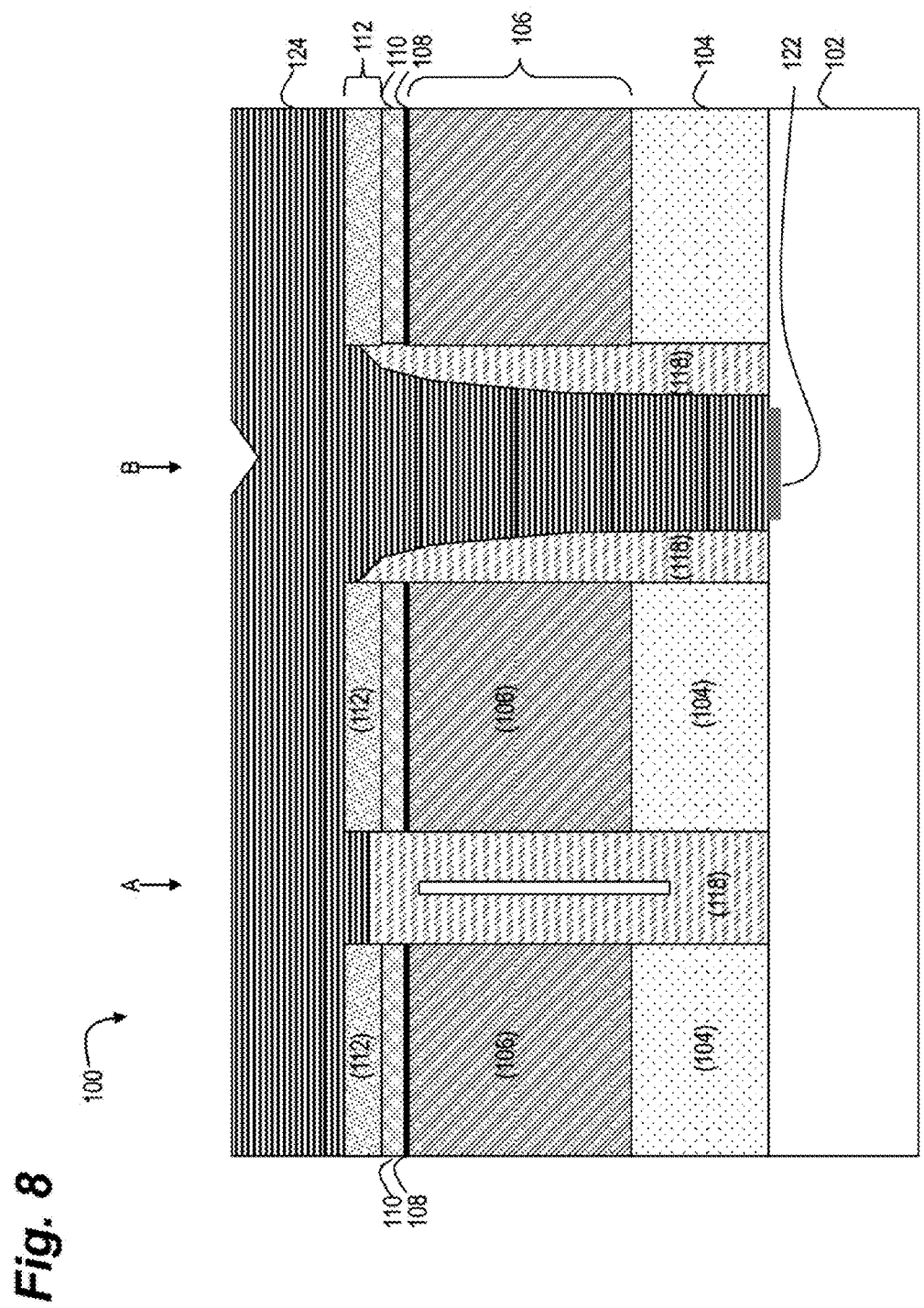
FIG. 8 is a schematic cross-sectional diagram illustrating a method of fabrication of one embodiment of the invention.

FIG. 8 illustrates the deposition of a conductive layer 124 into and filling the contact trench B that contacts and electrically connects to the silicon substrate 102. The conductors mentioned herein (such as the conductive layer 124) can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, and may be deposited using physical vapor deposition, chemical vapor deposition, or any other technique known in the art.

Figure 9:
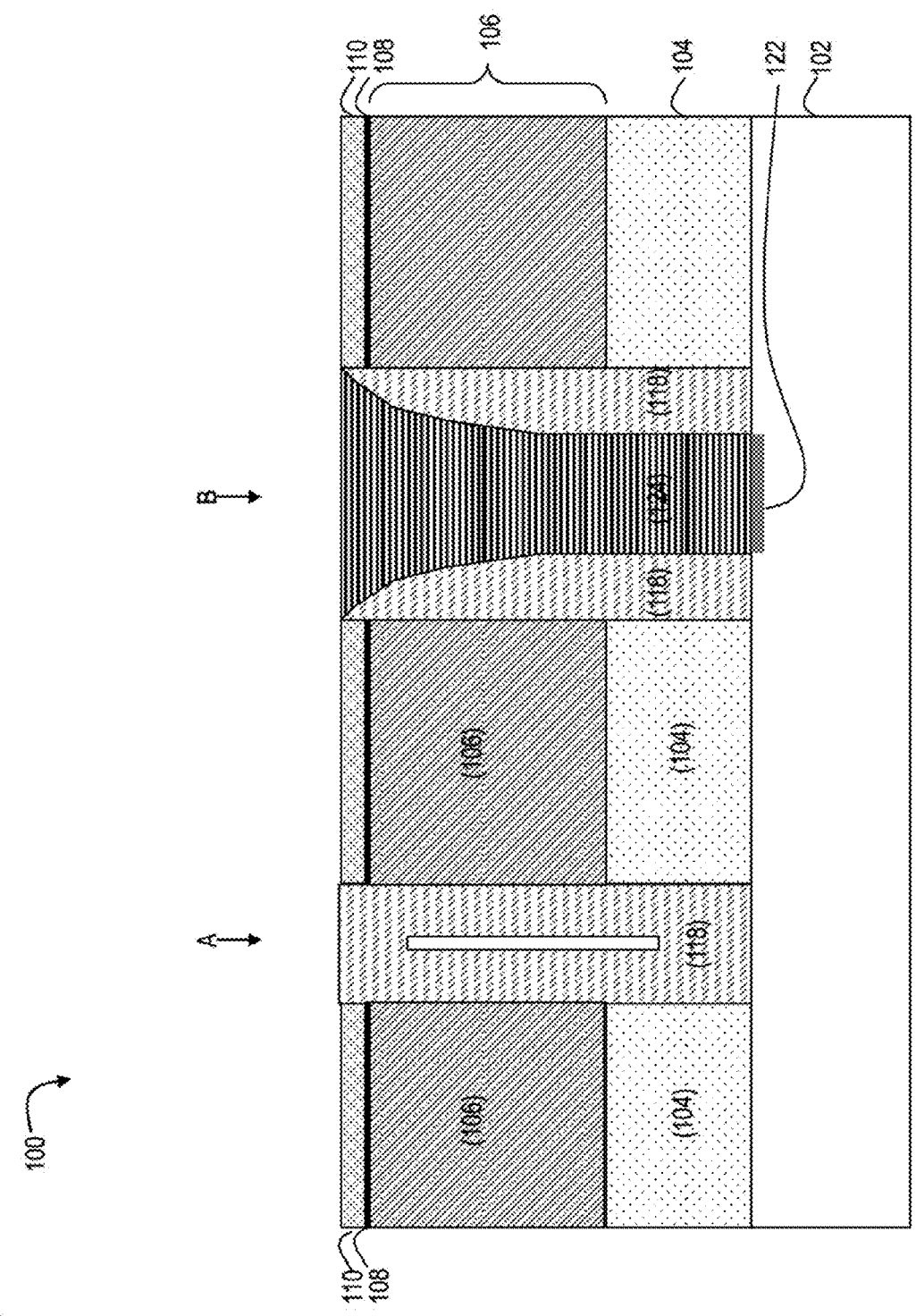
FIG. 9 is a schematic cross-sectional diagram illustrating a method of fabrication of one embodiment of the invention.

FIG. 9 illustrates any chemical-mechanical planarization (CMP) or equivalent etchback process that removes of the polysilicon layer 124 and polysilicon layer 112 to the upper surface or within the silicon nitride layer 110.

Figure 10:
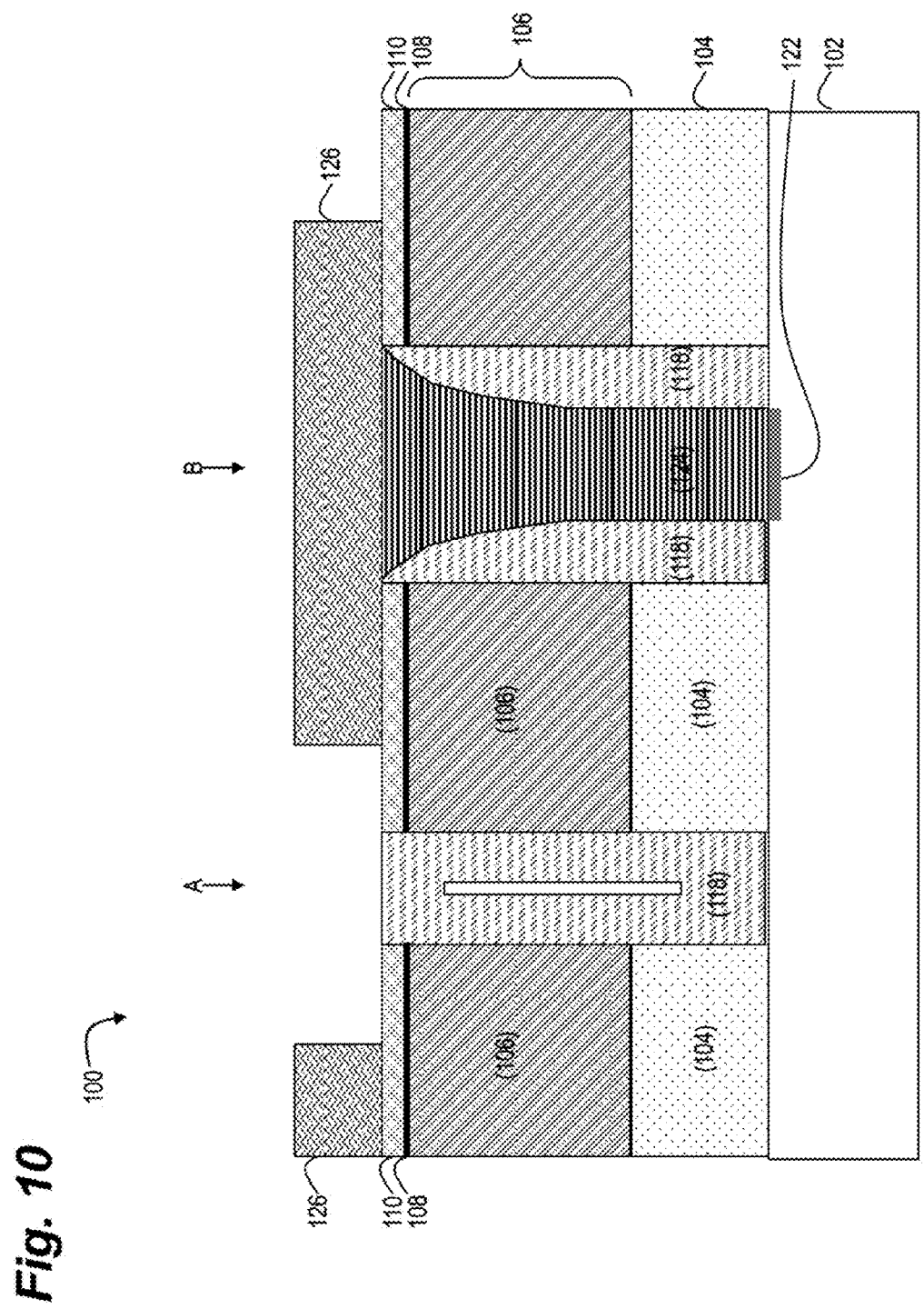
FIG. 10 is a schematic cross-sectional diagram illustrating a method of fabrication of one embodiment of the invention.

FIG. 10 illustrates the deposition of a photoresist mask layer 126 applied the upper surface of layer 112 to prepare to apply an etching or stripping process for shallow trench isolation between separate devices, for example, SOI devices in separated regions within a common SOI region/layer 106.

Figure 11:
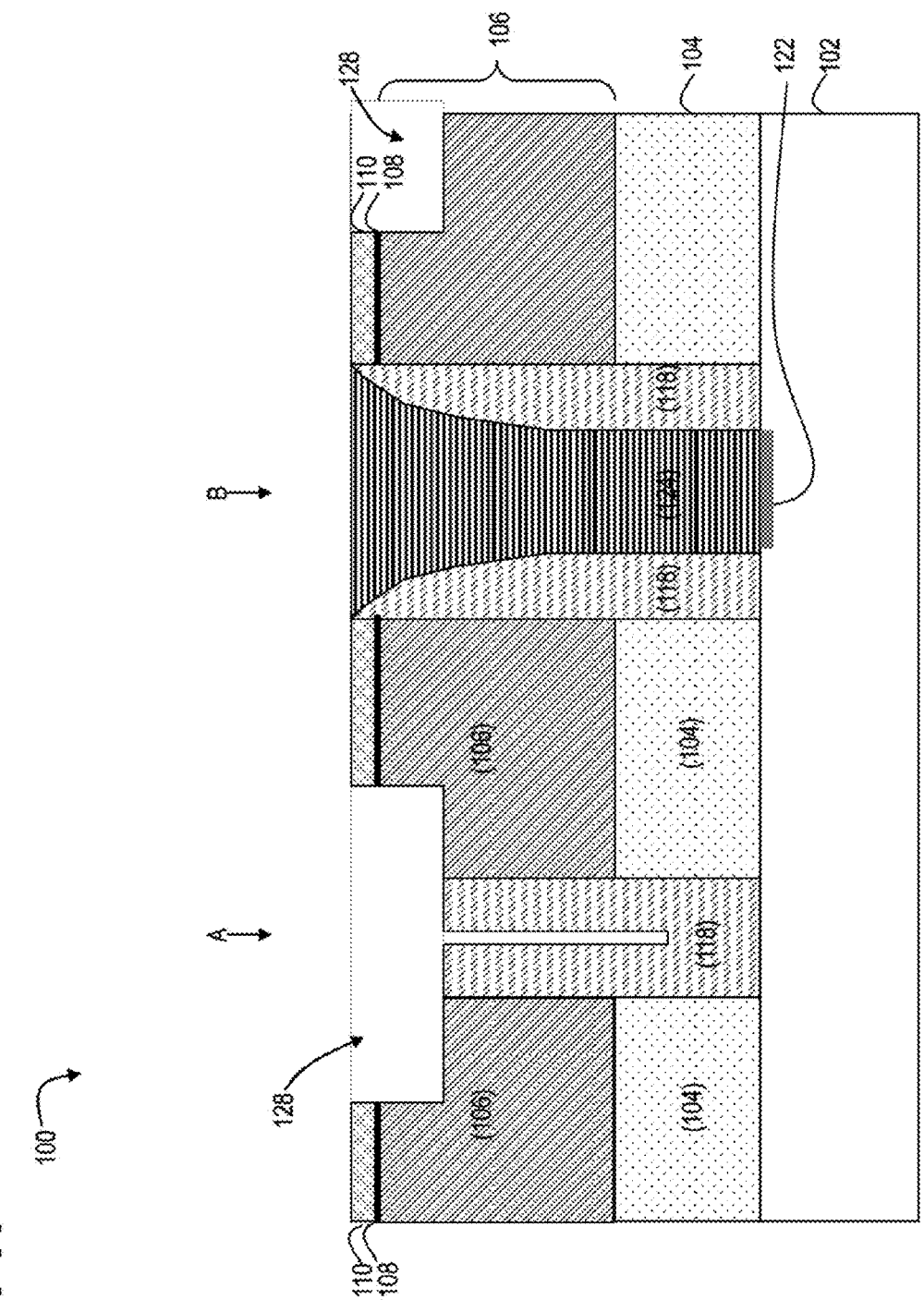
FIG. 11 is a schematic cross-sectional diagram illustrating a method of fabrication of one embodiment of the invention.
Figure 12:
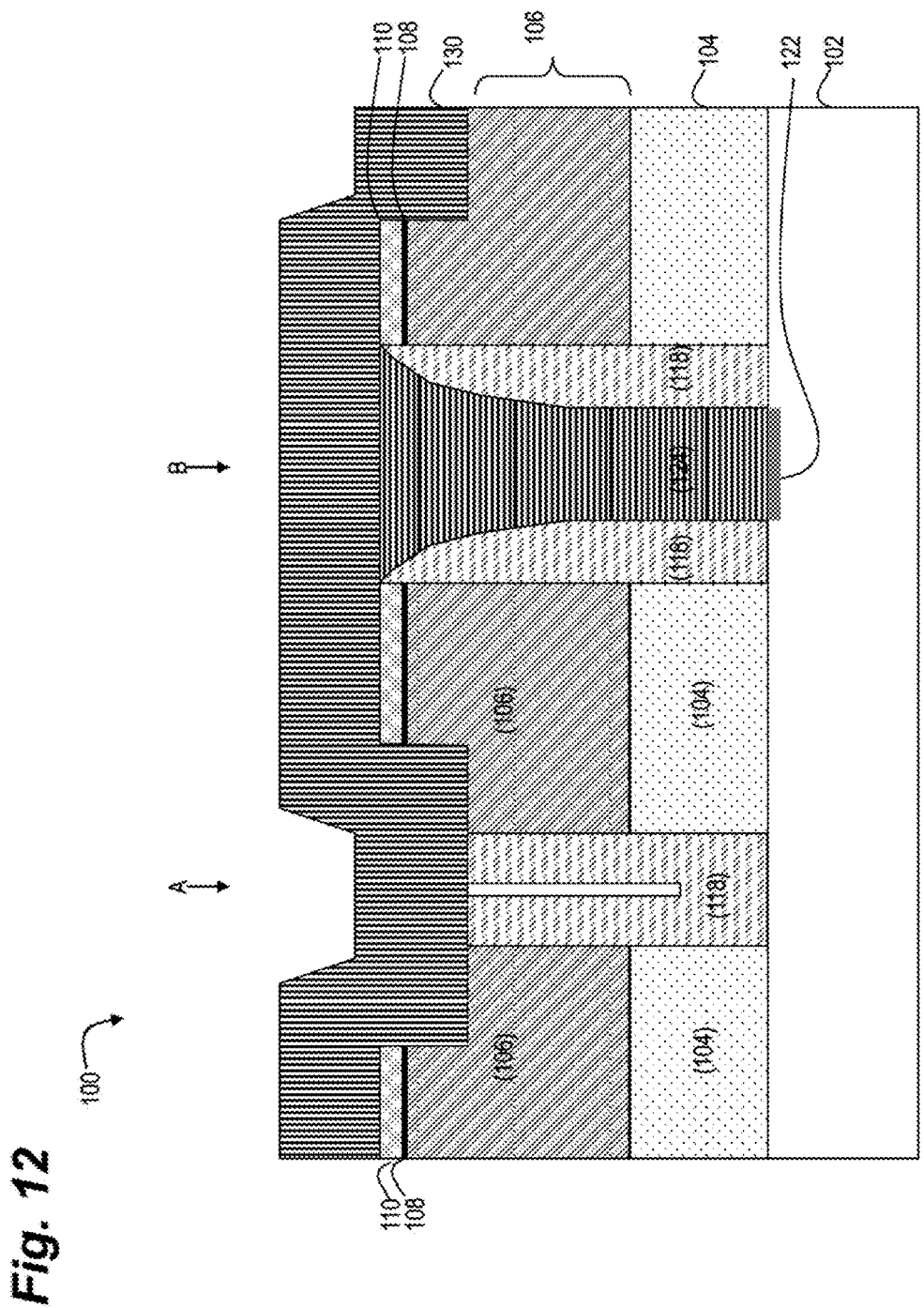
FIG. 12 is a schematic cross-sectional diagram illustrating a method of fabrication of one embodiment of the invention.
Figure 13:
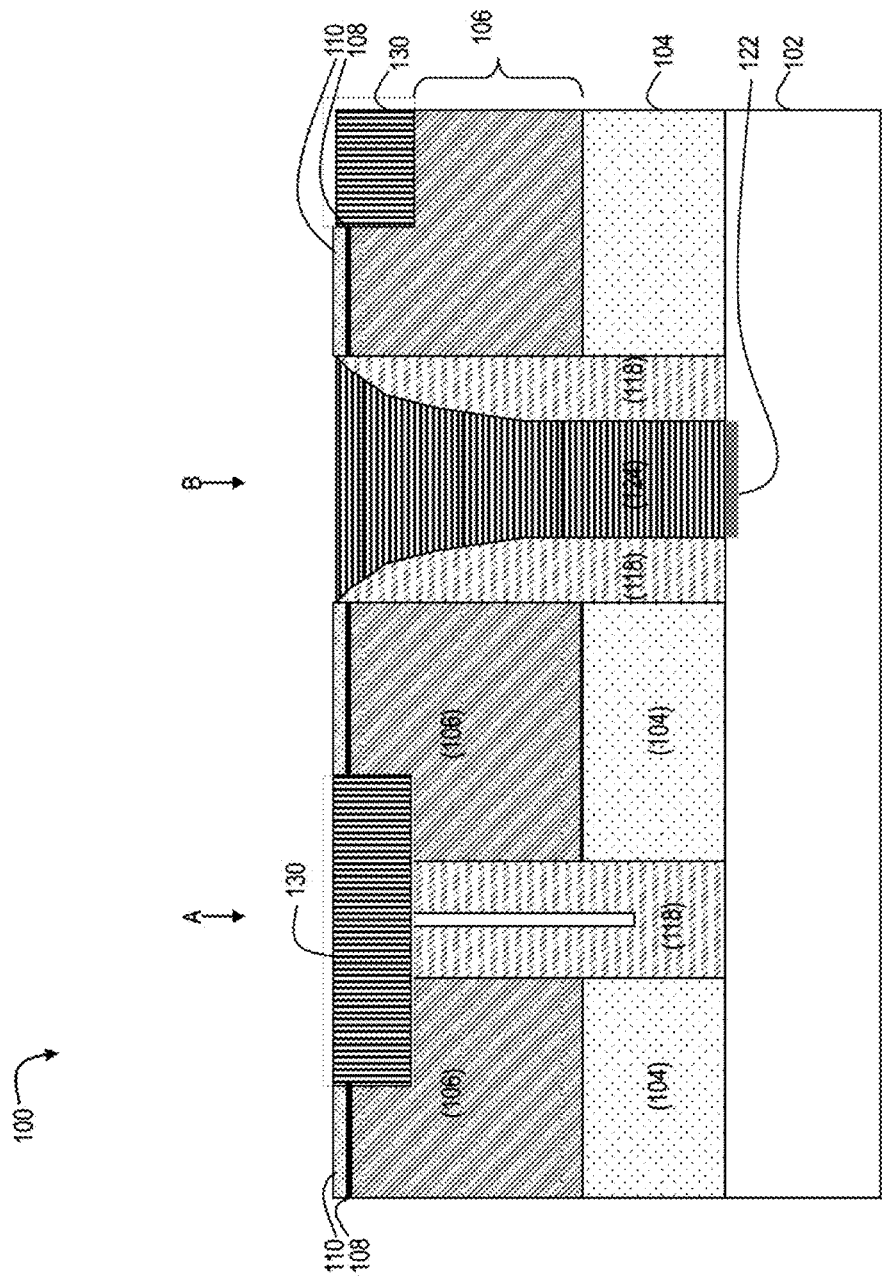
FIG. 13 is a schematic cross-sectional diagram illustrating a method of fabrication of one embodiment of the invention.
Figure 14:
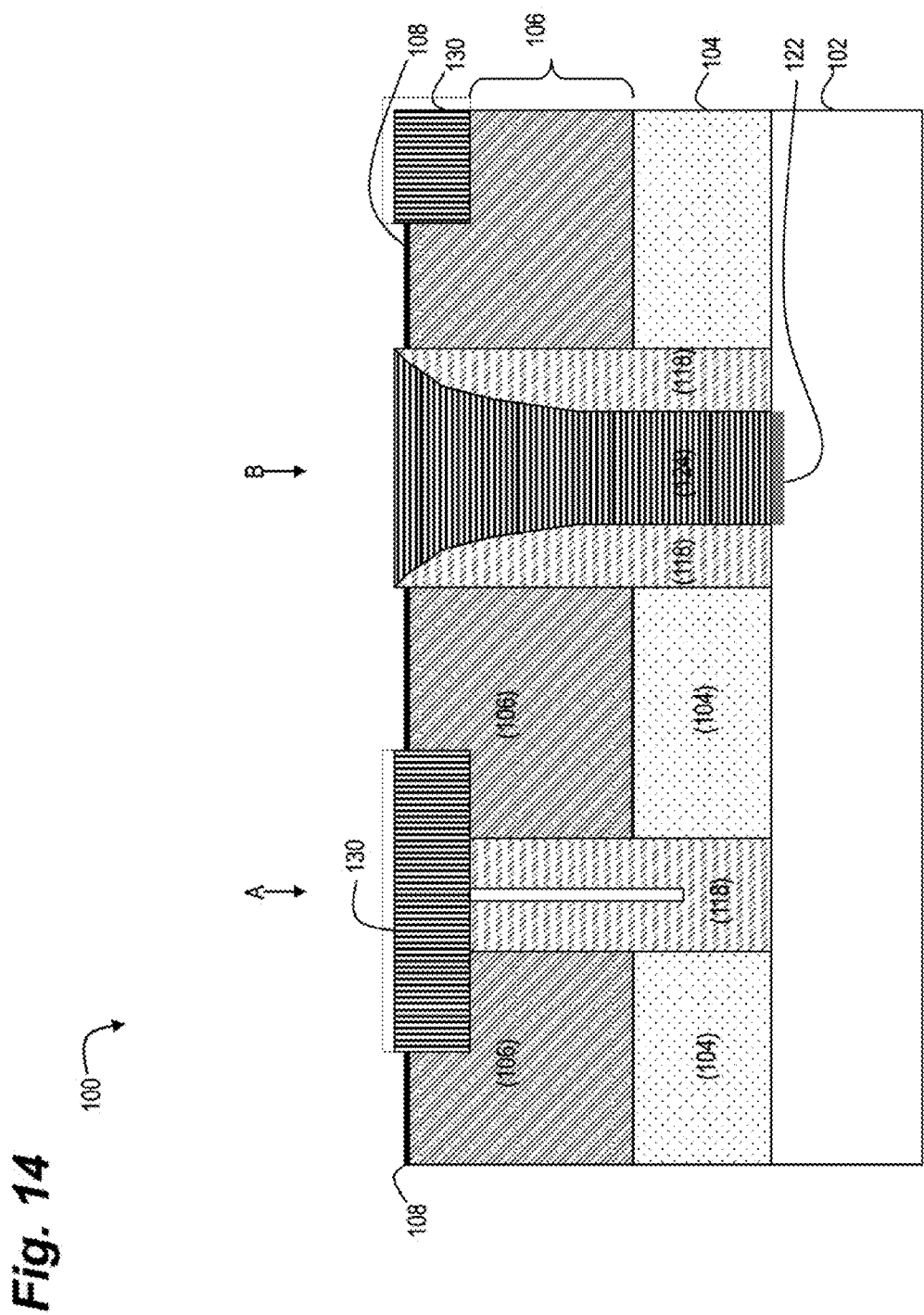
FIG. 14 is a schematic cross-sectional diagram illustrating a method of fabrication of one embodiment of the invention.

FIG. 11 illustrates the shape of shallow channels 128 in the top of the device 100 after the shallow trench creation and the removal of the photoresist mask layer 126. FIG. 12 illustrates a deposition of an oxide shallow trench fill layer 130 across the top of the device 100 and into the previously formed shallow trench channels 128. FIG. 13 illustrates an etch or an oxide CMP process that removes the oxide shallow trench fill layer and to a top surface of silicon nitride layer 110. FIG. 14 illustrates a nitride strip process that complete removes silicon nitride layer 110.

Thus, an isolation trench A is formed as a ring around the region to be isolated, for example SOI devices in separated regions in SOI layer 106. Once complete, the region of SOI is bounded below by the buried oxide (BOX) layer 104 and the lateral sides by a ring of oxide 118 in the filled trench A. The isolation trench is differentiated from the contact trench by selecting the appropriate trench width relative to the oxide (118) deposition thickness. The isolation trench width will be less than twice the deposition thickness, while the contact trench width will be more than twice the deposition thickness.

Figure 15:
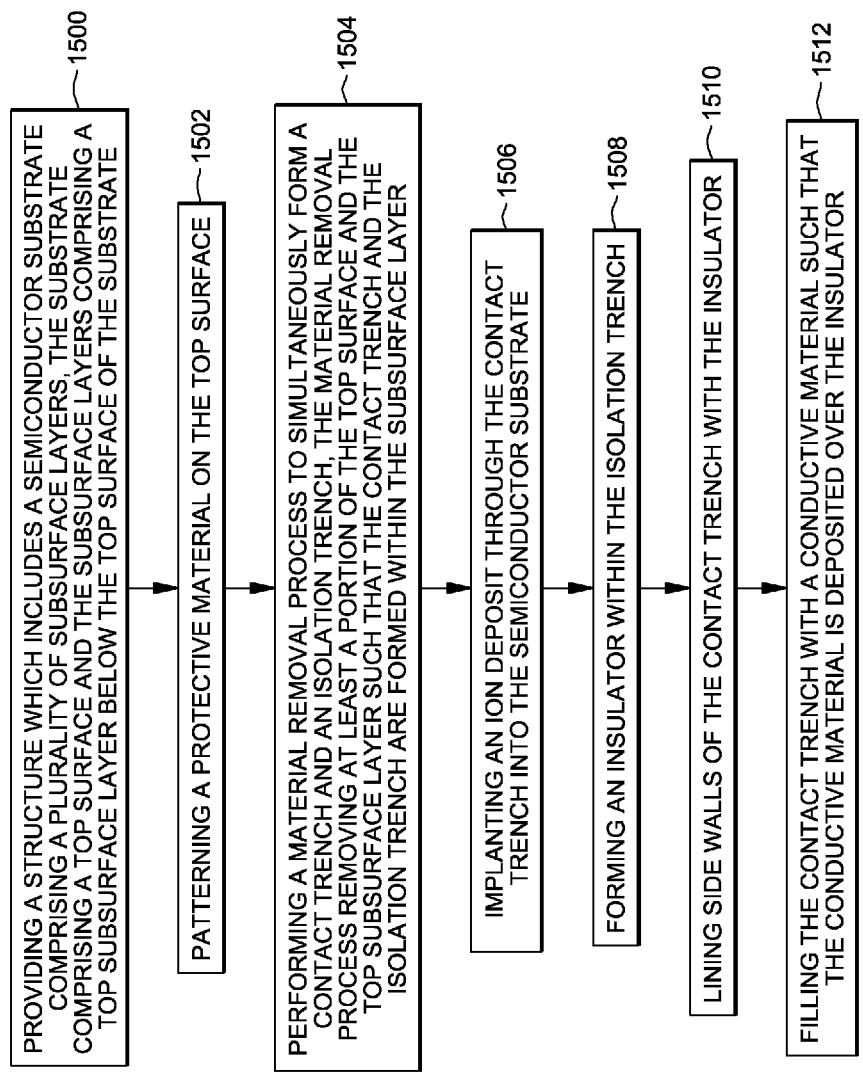
FIG. 15 illustrates a logic flowchart of a method of fabrication of an embodiment of the invention.

FIG. 15 illustrates a logic flowchart of a semiconductor fabrication method that includes providing a structure which includes a semiconductor substrate comprising a plurality of subsurface layers 1500. The substrate comprises a top surface and the subsurface layers comprise a top subsurface layer below the top surface of the substrate. A protective material is patterned on the top surface 1502. A material removal process is performed to simultaneously form a contact trench and an isolation trench 1504. The material removal process removes at least a portion of the top surface and the top subsurface layer such that the contact trench and the isolation trench are formed within the subsurface layer. Ions may be deposited through the contact trench into the semiconductor substrate 1506. An insulator is formed within the isolation trench 1508, and side walls of the contact trench are lined with the insulator 1510. The contact trench is then filled with a conductive material such that the conductive material is deposited over the insulator 1512.

Another exemplary embodiment of the invention includes connecting the contact trench to the semiconductor substrate. Another exemplary embodiment of the invention includes wherein one of the plurality of subsurface layers further comprises a silicon-on-insulator (SOI) layer, the method further including electrically isolating a plurality of areas of the silicon-on-insulator layer with the isolation trench. Another exemplary embodiment of the invention includes filling the isolation trench with silicon dioxide.

Another exemplary embodiment of the invention includes lining the contact trench with silicon dioxide. Another exemplary embodiment of the invention includes filling the contact trench with polysilicon. Another exemplary embodiment of the invention includes simultaneously performing forming the insulator within the isolation trench, and lining the contact trench with the insulator. The embodiments of the invention provides the simultaneous formation of electrical isolation of multiple silicon-on insulator (SOI) regions and through-BOX contacts thereby reducing fabrication cost and time with a single operation.

The resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

What is claimed is:

1. A semiconductor fabrication method comprising:
providing a structure which includes a semiconductor substrate comprising a top substrate surface and a plurality of subsurface layers comprising a silicon-oxide layer and silicon-on-insulator (SOI) layer, said plurality of subsurface layers including a top surface;
patterning a protective material on said top surface;
performing a material removal process to simultaneously form a contact trench and an isolation trench, said material removal process removing at least a portion of said top surface and a portion of said subsurface layers such that said contact trench and said isolation trench are formed on said top substrate surface of said semiconductor substrate;
forming an insulator within said isolation trench;
lining said contact trench with said insulator;
boring a channel in said contact trench by removing a portion of said insulator to expose said top surface of said semiconductor substrate; and
filling said contact trench with a conductive material such that said conductive material is deposited over said insulator and said conductive material is in contact with said semiconductor substrate via said channel,
wherein said conductive material consists of only polysilicon.

2. The method according to claim 1, further comprising:
connecting said contact trench to said semiconductor substrate.

3. The method according to claim 1, said method further comprising:
electrically isolating a plurality of areas of said silicon-on-insulator layer with said isolation trench.

4. The method according to claim 1, wherein forming said insulator within said isolation trench further comprises:
filling said isolation trench with silicon dioxide.

5. The method according to claim 1, wherein lining said contact trench with said insulator further comprises:
lining said contact trench with silicon dioxide.

6. The method according to claim 1, wherein said forming said insulator within said isolation trench, and lining said contact trench with said insulator are performed simultaneously.

7. A semiconductor fabrication method comprising:
providing a structure which includes a semiconductor substrate comprising a top substrate surface and a plurality of subsurface layers comprising a silicon-oxide layer and silicon-on-insulator (SOI) layer, said plurality of subsurface layers including a top surface;
patterning a protective material on said top surface;
performing a material removal process to simultaneously form a contact trench and an isolation trench, said material removal process removing at least a portion of said top surface and a portion of said subsurface layers such that said contact trench and said isolation trench are formed on said top substrate surface of said semiconductor substrate;
forming an insulator within said isolation trench;
lining side walls of said contact trench with said insulator;

boring a channel in said contact trench by removing a portion of said insulator to expose said top surface of said semiconductor substrate; and filling said contact trench with a conductive material such that said conductive material is deposited over said insulator and said conductive material is in contact with said semiconductor substrate via said channel, wherein said conductive material consists of only polysilicon.

8. The method according to claim 7, further comprising:
connecting said contact trench to said semiconductor substrate.

9. The method according to claim 7, said method further comprising:
electrically isolating a plurality of areas of said silicon-on-insulator layer with said isolation trench.

10. The method according to claim 7, wherein forming said insulator within said isolation trench further comprises:
filling said isolation trench with silicon dioxide.

11. The method according to claim 7, wherein lining said contact trench with said insulator further comprises:
lining said contact trench with silicon dioxide.

12. The method according to claim 7, wherein said forming said insulator within said isolation trench, and lining said contact trench with said insulator are performed simultaneously.

13. A semiconductor fabrication method comprising:
providing a structure which includes a semiconductor substrate comprising a top substrate surface and a plurality of subsurface layers comprising a silicon-oxide layer and silicon-on-insulator (SOI) layer, said plurality of subsurface layers including a top surface;

patterning a protective material on said top surface;

performing a material removal process to simultaneously form a contact trench and an isolation trench, said material removal process removing at least a portion of said top surface and a portion of said subsurface layers such that said contact trench and said isolation trench are formed on said top substrate surface of said semiconductor substrate;

implanting an ion deposit through said contact trench into said semiconductor substrate;

forming an insulator within said isolation trench;

lining side walls of said contact trench with said insulator; and filling said contact trench only with polysilicon such that said polysilicon is deposited over said insulator.

14. The method according to claim 13, further comprising:
connecting said contact trench to said semiconductor substrate.

15. The method according to claim 13, said method further comprising:
electrically isolating a plurality of areas of said silicon-on-insulator layer with said isolation trench.

16. The method according to claim 13, wherein forming said insulator within said isolation trench further comprises:
filling said isolation trench with silicon dioxide.

17. The method according to claim 13, wherein lining said contact trench with said insulator further comprises:
lining said contact trench with silicon dioxide.

18. The method according to claim 13, wherein said forming said insulator within said isolation trench, and lining said contact trench with said insulator are performed simultaneously.

* * * * *